(12) United States Patent
Wen

(10) Patent No.: US 7,154,422 B2
(45) Date of Patent: Dec. 26, 2006

(54) SCHEME AND METHOD FOR TESTING ANALOG-TO-DIGITAL CONVERTERS

(75) Inventor: Yun-Che Wen, Tainan (TW)

(73) Assignee: National Cheng Kung University, Tainan (TW)

( * ) Notice: Subject to any disclaimer, the term of this patent is extended or adjusted under 35 U.S.C. 154(b) by 0 days.

(21) Appl. No.: 11/168,543

(22) Filed: Jun. 29, 2005

(65) Prior Publication Data

US 2006/0001560 A1 Jan. 5, 2006

(30) Foreign Application Priority Data

Jun. 30, 2004 (TW) .............................. 93119313 A

(51) Int. Cl.
*H03M 1/10* (2006.01)

(52) U.S. Cl. ....................... 341/120; 341/155
(58) Field of Classification Search ................ 341/120, 341/155

See application file for complete search history.

(56) References Cited

U.S. PATENT DOCUMENTS

| 5,132,685 | A | * | 7/1992 | DeWitt et al. ............... 341/120 |
| 5,305,003 | A | * | 4/1994 | Han ............................. 341/120 |
| 5,712,633 | A | * | 1/1998 | Bae .............................. 341/120 |
| 5,854,598 | A | * | 12/1998 | De Vries et al. ............. 341/120 |
| 6,333,706 | B1 | * | 12/2001 | Cummings et al. .......... 341/120 |
| 6,339,338 | B1 | * | 1/2002 | Eldridge et al. ............. 324/765 |
| 6,339,388 | B1 | * | 1/2002 | Matsumoto .................. 341/120 |
| 6,567,021 | B1 | * | 5/2003 | Burns ........................... 341/120 |
| 6,642,870 | B1 | * | 11/2003 | Renovell et al. ............. 341/120 |

* cited by examiner

*Primary Examiner*—Rexford Barnie
*Assistant Examiner*—Nguyen Khai
(74) *Attorney, Agent, or Firm*—Rabin & Berdo, P.C.

(57) ABSTRACT

The invention provides a test scheme of analog-to-digital converters and method thereof. It comprises: a control circuit, a step-ramp signal generator, a multiplexer, an n+m-bit counter, and a test analyzing circuit, wherein m=1, 2, 3 . . . , based on desired accuracy of the test scheme. A clock pulse is coupled to the n+m-bit counter and a control circuit for regulating duty cycle, amplitude, and frequency. It is also coupled to a step-ramp signal generating circuit for being integrated as a test signal source. Therefore the step-ramp signal can synchronize with the n+m-bit counter, and the output codes are applied to compare with output codes of the n-bit ADCs for completely digitally analyzing ADC's parameters. The step-ramp signal is divided into several segments, each is integrated by the regulated clock signal with different duty cycles, which increases integrating time to compensate leakage currents of the capacitor and improve linearity of the step-ramp signal.

9 Claims, 5 Drawing Sheets

US 7,154,422 B2

SCHEME AND METHOD FOR TESTING ANALOG-TO-DIGITAL CONVERTERS

BACKGROUND OF THE INVENTION

1. Field of the Invention

A test scheme is invented for testing Analog-to-Digital Converters (ADCs). In this scheme, a system clock pulse is used to drive an n+m-bit counter and the frequency, duty cycle and amplitude of the system clock pulse is regulated to become a regulated clock signal that is integrated by an Integrator to form a called step-ramp signal as a test stimulus, where n is the resolution of the ADC under test and m=1, 2, 3 . . . , based on the desired accuracy of the test scheme. With this design, the step-ramp stimulus can correctly synchronize with the n+m-bit counter whose output codes provide the references for testing the n-bit ADC. The Test Response Analyzer can be designed with completely digital circuits to analyze the output codes of the ADC and the counter for identifying whether the specific parameters of the ADC are within acceptable ranges.

On the other hand, the step-ramp stimulus is divided into several segments. Various segments are generated by the integrations of the regulated clock signal with different duty cycles. Gradually increasing duty cycles for integrations compensates the nonlinearly rising linkage currents depending on rising voltages of the segments. The main characteristics of the proposed test scheme include:
1. The design of the high accurate step-ramp signal as a test stimulus for testing Analog-to-Digital converters.
2. The design of the compensation mechanism of linkage current with enlarging duty cycle for integration.
3. The design of correct synchronization between the stimulus and outputs of the reference counter.
4. The design of the Test Response Analyzer with completely digital circuits.

2. Description of the Prior Art

With advanced technologies of IC design and manufacture, a complex mixed-signal system circuits which includes digital, analog and interface parts are integrated in a chip. High complex designs make the difficulty in chip testing. As a result, chip testing cost has drastically increased and may exceed the design cost. One of most effective solutions is by the process of design for testability (DFT) which refers to the design efforts to ensure that the circuits in a chip are easily testable. In mixed-signal chips, Analog-to-Digital converters (ADCs) and Digital-to-Analog converters (DACs) are important devices to work as interfaces between digital and analog circuits. The qualities of converters dominate the performances of mixed-signal chips. How to develop DFT techniques for testing converters has become an important issue.

The converters are usually tested by examine whether the values of dynamic and static parameters are within acceptable ranges. In general, dynamic parameters contain Settling Time, Signal-to-Noise Ratio (SNR), Total Harmonic Distortion (THD) and Effective Number of Bits (ENOB). Static parameters include Offset Error, Gain Error, Integral Non-linearity (INL) and Differential Non-linearity (DNL). For detecting parameters, a test scheme mainly contains a test signal generator to produce test stimuli, a reference signal generator to produce references and a test response analyzer to identify the values of parameters whether they are within acceptable ranges.

For testing dynamic parameters, sine or triangle wave which is cyclic signal is usually used as a test stimulus in the scheme. For analyzing dynamic parameters based on cyclic test signal, this scheme needs a high performance CPU to do complex calculation and memory space for data storage during calculation. The calculation performs Fourier Transform analyses to extract out parameters. If the scheme is implemented in chips to become a Built-In Self-Test structure, the test signal generator for generating cyclic signals, CPU and memory exhaust large chip area. Therefore the analyses of dynamic parameters are preferred to be done by external instruments to save chip area.

When testing static parameters, highly accurate stimuli, reference signals and a specific Test Response Analyzer are designed in the scheme. Multiple discrete stage, continuous ramp down or continuous ramp up signals are used as test stimuli in the scheme. The reference signals can be defined by the outputs of the ideal ADC with ideal input stimuli. The Test Response Analyze performs the comparisons between the reference signals and the outputs of ADC under test. However, for high resolution ADC testing, multiple high accurate stage stimuli ($2^n$ stimuli for n-bit ADCs) are difficult to be implemented in the chip because they exhaust large chip area. Meanwhile, switching the reference stimuli via analog switches generates noises and spikes that influence the accuracy of reference stimuli. Therefore it cannot be applied in the chip for high resolution converter testing.

Another embodiment is to apply increasing or decreasing ramp signals as test stimuli. The ramp signal is always generated by an integrator. The linearity of the signal is greatly affected by the leakage current of the capacitor in the integrator. This drawback greatly influences the accuracy of the test scheme. Therefore, the ramp signals are usually used as test stimuli for testing low resolution ADCs less than 10 bits.

FIG. 1 is a perspective view of ADC's static parameter testing of prior art. Wherein the test signal generator (A1) generates multiple voltages ($V_{in}$) as test stimuli that are inputted to the ADC under test (A2). Then the outputs of A2 are connected to a Digital-to-Analog converter (DAC) (A3). The DAC converts the digital outputs of the ADC into analog signals. A comparator A4 compares the input voltage $V_{in}$ with the output voltage ($V_{out}$) of the DAC and analyzes comparison results. The main issues in this scheme are the necessity of the DAC that always has higher resolution than that of the ADC. If this scheme is implemented with Built-In Self-Test designs, the test signal generator and the DAC will exhaust large chip area.

The qualities of converters dominate the performances of mixed-signal chips. Researchers and engineers make efforts to develop effective test schemes to examine converter qualities. The topic of developing test scheme for testing converters has become a specific research filed. Thus, to have an improved test scheme and method thereof of converters gives resolutions of chip testing issues.

SUMMARY OF THE INVENTION

The one of objects of the invention is to provide a test scheme of analog-to-digital converters and method thereof. A system clock pulse is used to drive a counter and its frequency, duty cycle, and amplitude is regulated to become a regulated clock signal. An Integrator as a test signal generator makes the integration of the regulated clock signal to form a step-ramp signal as a test stimulus that correctly synchronizes with the counter.

Another object of the invention is to provide a test scheme of analog-to-digital converters and method thereof. The scheme applies a step-ramp signal which is correctly synchronous with an n+m-bit counter, where n is the resolution of the ADC under test and m=1, 2, 3 . . . , based on the desired accuracy of the test scheme. The voltages of the step-ramp signal can be truly estimated by the outputs of the counter. Therefore the outputs of the n+m-bit counter can be applied as a reference signals to be compared with outputs of the n-bit ADC under test. Then, the Test Response Analyzer is designed with completely digital circuits. This design simplifies the complexity of the Test Response Analyzer and reduces the cost of the chips.

Another object of the invention is to provide a test scheme of analog-to-digital converters and method thereof. The Test Response Analyzer can regularly be designed by analyzing the n-bit outputs of the ADC and the n most significant bits of the n+m-bit counter to detect Offset Error, Gain Error, and Integrated Non-linearity (INL). By analyzing the m least significant bits of the n+m counter, the parameter of Differential Non-linearity (DNL) can be detected. With increasing the value of m, the accuracy of the test scheme is enhanced. The design of the Test Response Analyzer can follow a regular method when the value of m is changed. The Test Response Analyzer is also available to be used for testing dynamic parameters.

Another object of the invention is to provide a test scheme of analog-to-digital converters and method thereof. For testing n-bit ADCs, $2^{n-1}$ or more ramp pieces are designed in the step-ramp signal. Each ramp piece is integrated during each cycle time. Ramp-piece-based discrete integrations for each cycle construct the whole step-ramp signal with great linearity. Furthermore, in the invention, by dividing the whole step-ramp signal into several segments, each segment containing lots of ramp pieces is integrated by different duty cycles of the regulated clock signal. Higher voltages of the segments are integrated by larger duty cycles of the regulated clock signal. This design of enlarging duty cycles for integrations to provide effective compensations of nonlinear linkage currents of the capacitor in the integrator that outputs the step-ramp signal.

Each middle point voltage ($V_k$) of the ramp piece is the ideal converting voltage of the digital output codes of the ADC form k-1 to k, where $0 \leq k \geq 2^{n-1}$. If the absolute accuracy sets to ½ LSB (Least Significant Bit), then the integrated voltage of each ramp piece is from $V_k$-½ LSB to $V_k$+½ LSB. The amount of voltage in each integrated ramp piece is 1 LSB (($V_k$+½ LSB)-($V_k$+½ LSB)) except the first ramp piece with the amount of ¾ LSB voltage. For higher absolution accuracy less than ½ LSB, the amount of voltages in integrated ramp pieces is decided based on the criterion of the above description for absolute accuracy ½ LSB.

Another object of the invention is to provide a test scheme of analog-to-digital converters and method thereof. The adjustment of the power supply of the control circuit generates various amplitudes of the regulated clock signal. Adjustable amplitude of the regulated clock signal for integration overcomes the unexpected deviations of semiconductor manufacture processes for generating the high accurate step-ramp signal.

BRIEF DESCRIPTION OF THE DRAWINGS

The drawings disclose illustrative embodiments of the present invention which serves to exemplify the various advantages and objects hereof, and are as follows:

FIG. 2-1 is a perspective view of generating the step-ramp signal of the invention;

PARTS LIST

A1—Test signal generator
A2—Analog-to-Digital converter under test
A3—Digital-to-Analog converter
A4—Comparator
11—Control circuit
12—Steps-ramp signal generator
13—Multiplexer
14—Analog-to-Digital converter under test
15—n+m-bit counter
2—Test response analyzer
21—INL detector performing detections of offset error, gain error and INL
22—DNL detector
31—Inputting test trig signal, system clock pulse, and power source voltage of Control Circuit
32—Measuring step-ramp signal
33—Identifying step-ramp signal
34—Adjusting power source voltage
35—Recording power source voltage
41—Inputting test trig signal, system clock pulse, and calibrated voltage of power source of Control Circuit
42—Generating step-ramp signal
43—Inputting step-ramp signal to the ADC under test
44—Outputting the output codes of the ADC and the counter
45—Transmitting the output codes of the ADC and the counter to the Test Response Analyzer
46—Performing comparisons between the output codes of the ADC and the counter
47—Outputting test results

DETAILED DESCRIPTION OF THE PREFERRED EMBODIMENT

For further understanding of the test scheme, test procedure, and characters of the invention, the inventor herein presents preferred embodiment with drawings and detail descriptions.

Figure 1:
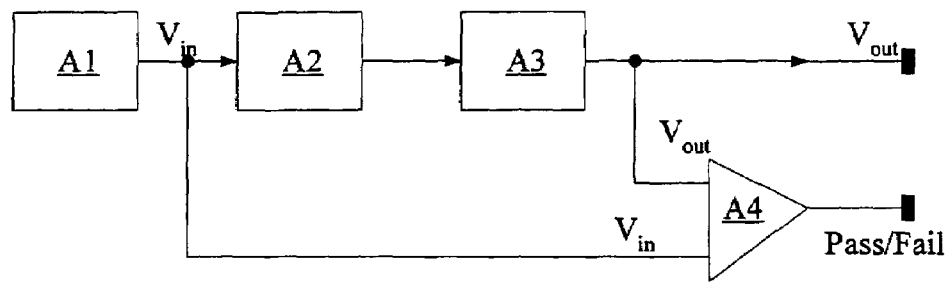
FIG. 1 is a perspective view of embodiment of static parameters testing of prior art.
Figure 2:
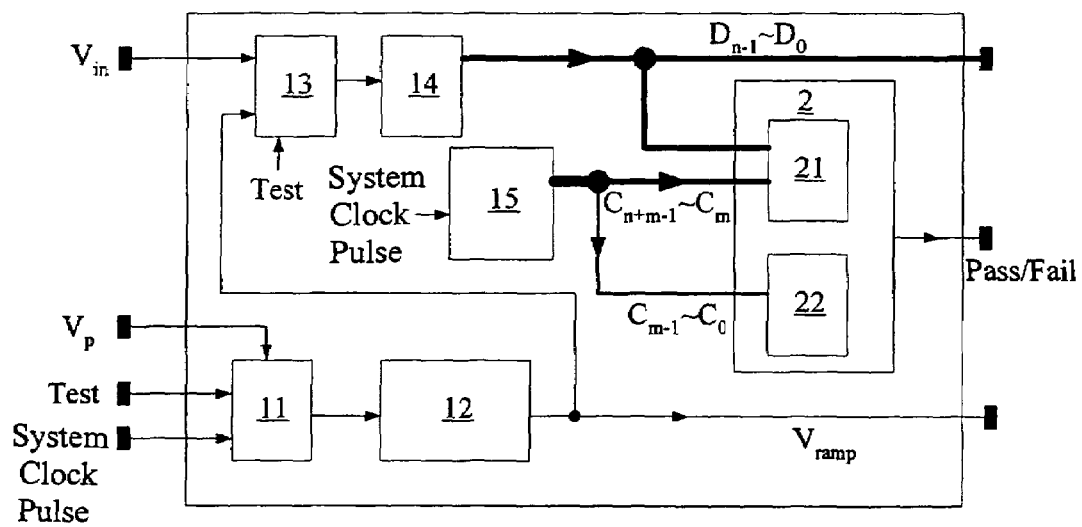
FIG. 2 is a perspective view of the test scheme of the invention.
Figures 1, 2:
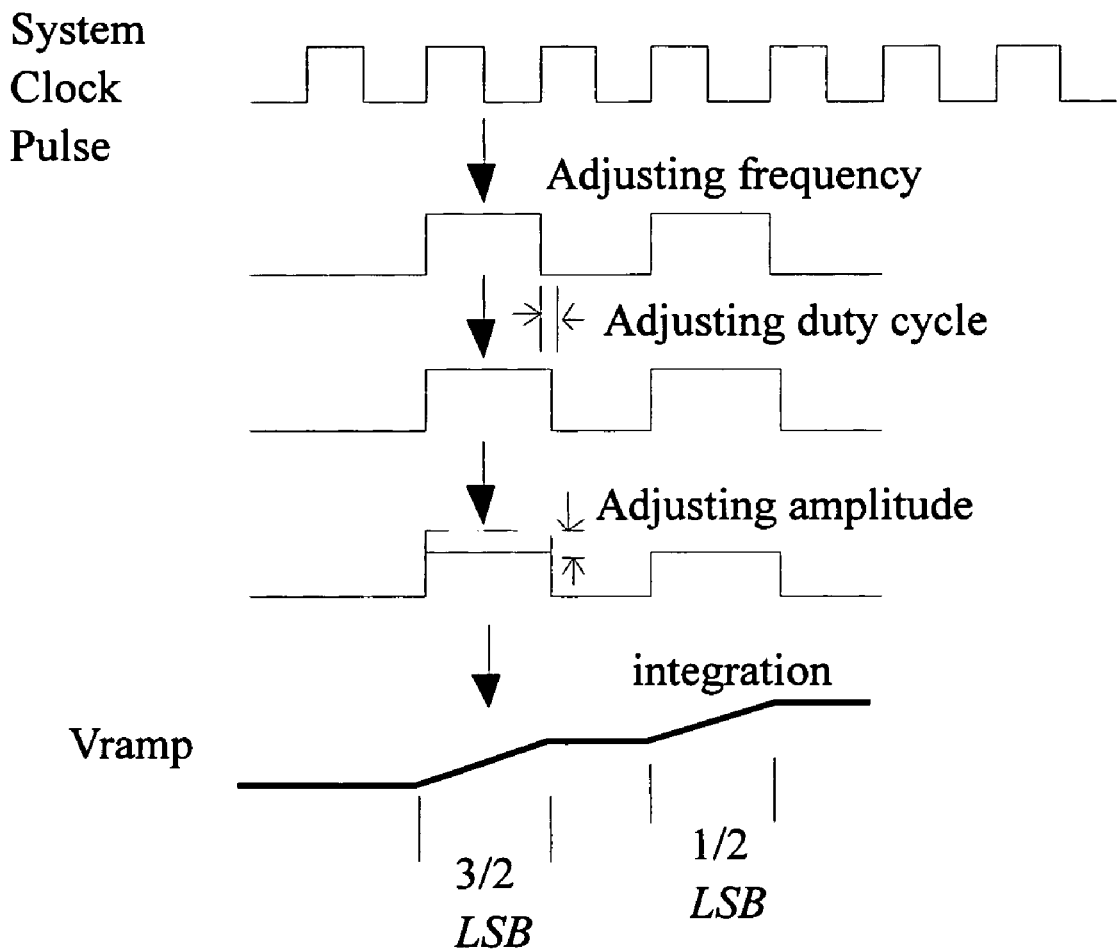

FIG. 2 illustrates the test scheme. The functions of components in the scheme are described in the following.

(1) Control Circuit 11: The Control Circuit generates the regulated clock signal after the frequency, duty cycle and amplitude of the system clock pulse is regulated. Test is a trig signal. When Test=1, the test scheme is activated in test mode. Otherwise Test=0, it is in normal mode. $V_p$ is the power source of the Control Circuit. Slightly adjusting the amplitude of the power source provides the little amplitude variation of the regulated clock signal for integration. This mechanism is designed to overcome the deviations in manufacture processes of the chips.

(2) Integrator 12: It produces the step-ramp stimulus named $V_{ramp}$ by integrating the regulated clock signal.

(3) AMUX 13: An analog multiplexer works as ADC's input signal selector for choosing either $V_{in}$ in normal mode when Test=0 or the step-ramp stimulus $V_{ramp}$ in test mode when Test=1.

(4) n-bit ADC 14: It is the device under test (DUT).

(5) n+m-bit Counter 15: Its output codes are utilized as references in test mode. The more m bits in the counter than ADC's resolution of n achieve the detection with the accuracy of $\frac{1}{2}^{m-1}$ LSB.

(6) Test Response Analyzer 2: It is composed of the INL detector 21 and DNL detector 22. The INL detector performs the Offset Error, Gain Error, and INL tests by comparing ADC's output code ($D_{n-1}$~$D_0$) with the n most significant bits ($C_{n+m-1}$~$C_m$) of the n+m-bit counter. The DNL detector examines the DNL parameter by analyzing the m least significant bits ($C_{m-1}$~$C_0$) of the n+m-bit counter.

In this scheme, when Test=0, it is operated in normal mode. The ADC receives the $V_{in}$ signal that is provides from the prior stage of circuits or external instruments. When Test=1, the scheme is operated in test mode for detecting the parameters of the ADC. In test mode two procedures are performed that are calibration and test procedures. In calibration procedure, a suitable voltage $V_p$ of the power source of the Control Circuit is searched out. It is achieved by providing the voltage $V_p$ and measuring the $V_{ramp}$ repeatedly. If the accuracy of $V_{ramp}$ meets the requirement, the voltage of $V_p$ is decided for the use in the test procedure.

Figure 3:
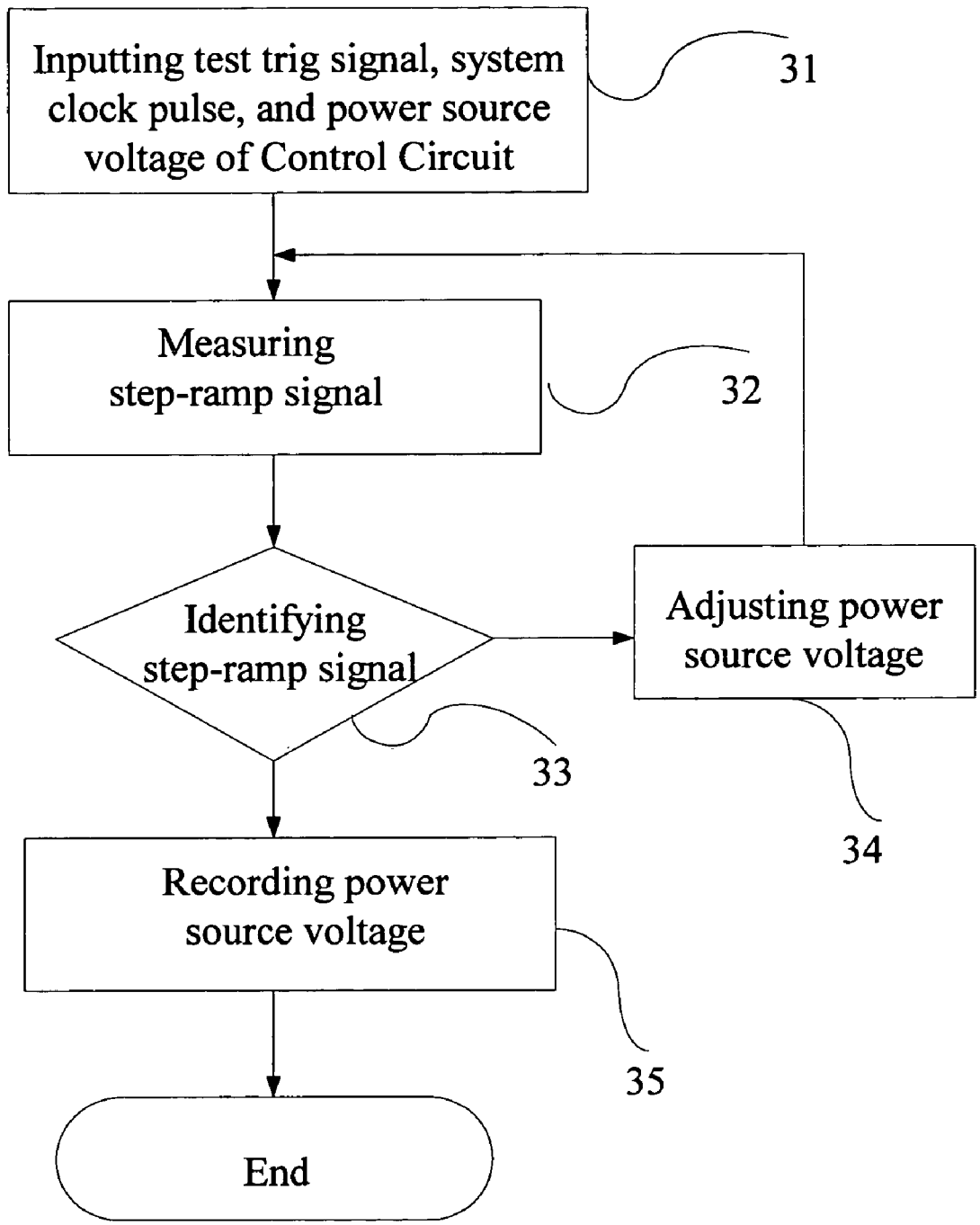
FIG. 3 is a flow chart of calibration process of the invention.

The invention is about a test scheme of Analog-to-Digital converters and method thereof. FIG. 3 illustrates the calibration procedure. Wherein the procedure comprises steps of:

(1) Step 31: Inputting test trig signal (Test=1) to activate calibration procedure, system clock pulse, power source (Vp) of the Control Circuit;

(2) Step 32: Measuring the step-ramp signal;

(3) Step 33: Identifying the step-ramp signal. If the accuracy of the signal meets the requirement, the voltage of the power source is decided. Then the Step 35 is done. Otherwise, performing the Step 34.

(4) Step 34: Adjusting the voltage of the power source and go to Step 32;

(5) Step 35: Recording the voltage of the power source.

Figure 4:
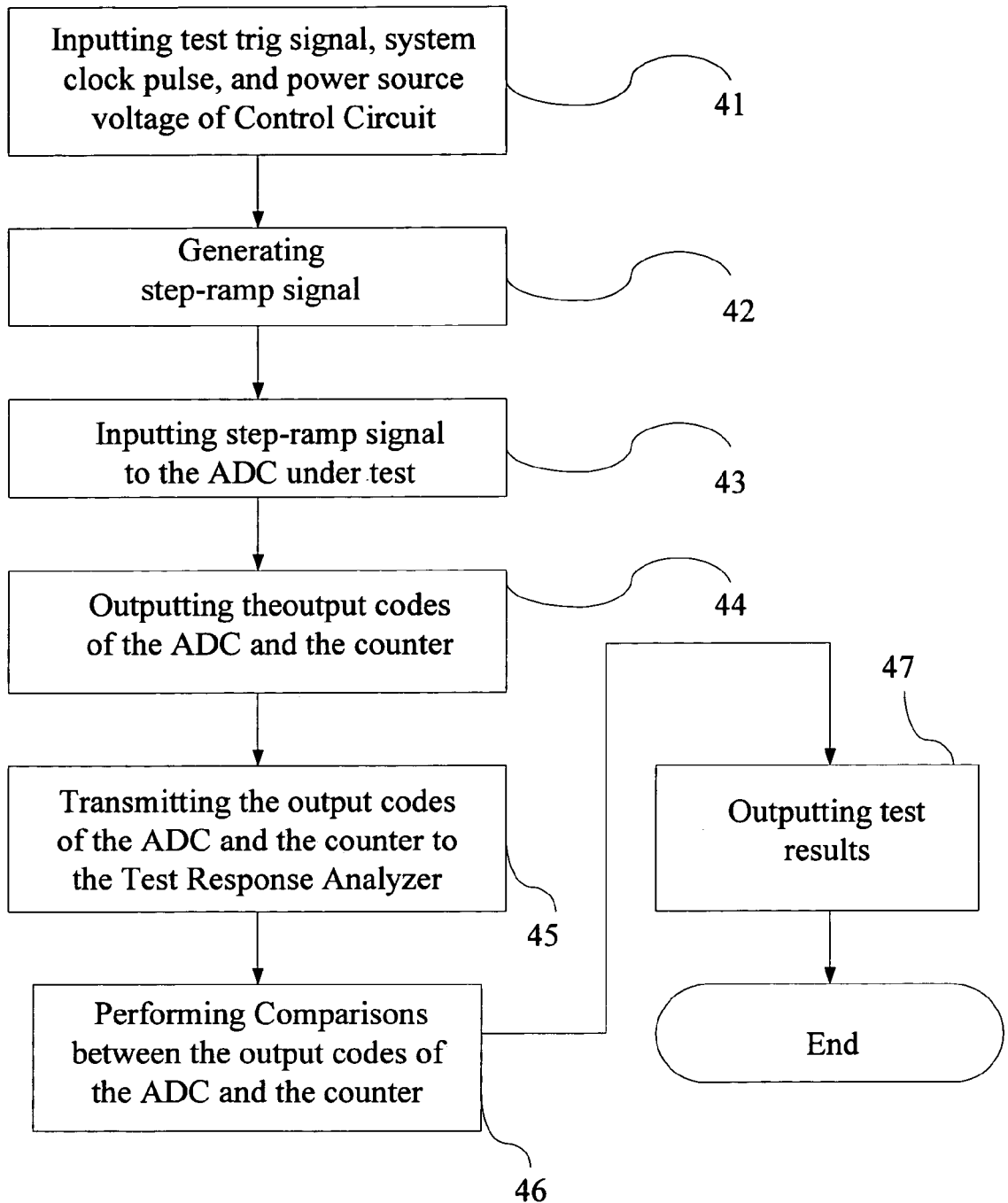
FIG. 4 is a flow chart of test process of the invention.

FIG. 4 is a flow chart of test procedure of the invention. After the calibration procedure, the accuracy of the step-ramp signal $V_{ramp}$ is ensured, and the test procedure for detecting parameters of the ADC 14 can be run. The procedure comprises steps of:

(1) Step 41: Inputting test trig signal (Test=1) to activate test procedure, system clock pulse, and calibrated power source voltage (Vp) of the control circuit. The system clock pulse is also inputted to the n+m-bit counter 15;

(2) Step 42: Generating the step-ramp signal; wherein the step-ramp signal $V_{ramp}$ is generated by the step-ramp signal generator 12 constructed by an integrator;

(3) Step 43: Inputting the step-ramp signal to the ADC under test 14, wherein the step-ramp signal $V_{ramp}$ is connected the ADC under test via the multiplexer 13;

(4) Step 44: Outputting the n-bit output codes ($D_{n-1}$~$D_0$) of the ADC 14 and the output codes ($C_{n+m-1}$~$C_0$) of the n+m-bit counter 15;

(5) Step 45: Transmitting the output codes of the ADC and the counter to the Test Response Analyzer 2; wherein the n-bit output codes ($D_{n-1}$~$D_0$) and the output codes ($C_{n+m-1}$~$C_0$) are inputted to the INL detector 21. The output codes ($C_{m-1}$~$C_0$) are send to the DNL detector.

(6) Step 46: Comparing processes: wherein the INL detector 21 processes the detection of Offset Error, Gain Error, and INL parameters and DNL Detector processes the detection of the DNL parameter;

(7) Step 47: Outputting the test results: if the each of Offset Error, Gain Error, INL, and DNL parameters are within the acceptable ranges, then the Test Response Analyzer set Pass/Fail=1. If they are not within the acceptable ranges, the Pass/Fail is set to 0.

Figure 5:
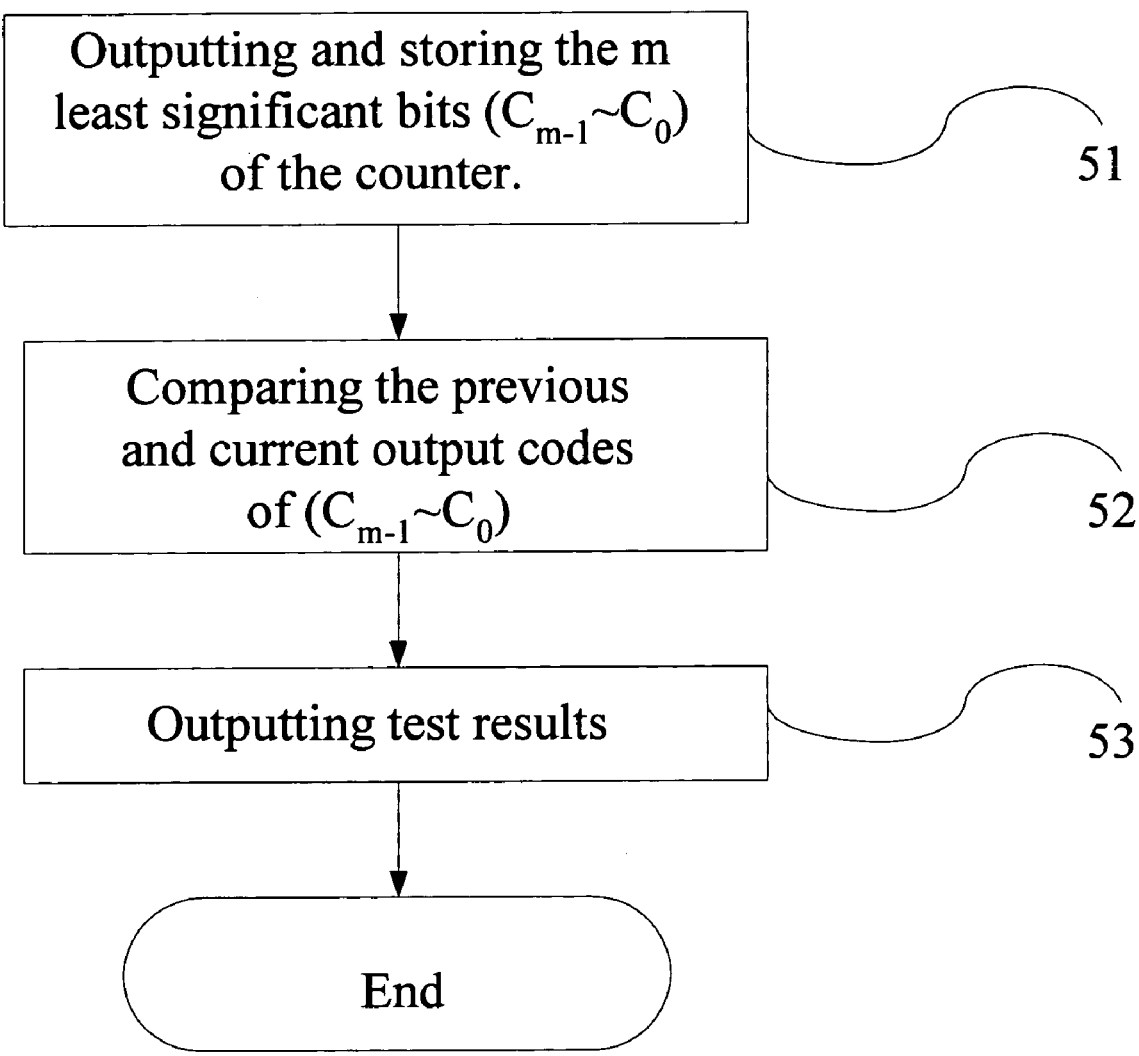
FIG. 5 is a flow chart of static test process of the invention.

FIG. 5 is a flow chart of test procedure of the invention. Moreover, there is another output codes ($C_{m-1}$~$C_0$) divided from the output codes ($C_{n+m-1}$~$C_0$) and inputted to a DNL detector 22 which contains m bits memories for storing output codes ($C_{n+m-1}$~$C_0$) when the ADC outputs the previous code k-1. At each transition of output codes of the ADC under test, the DNL detector makes comparisons between the stored output codes ($C_{n+m-1}$~$C_0$) when the ADC outputs the previous codes k-1 and the current output codes ($C_{n+m-1}$~$C_0$) when the ADC outputs the current code k for the analyses of DNL. The test process comprises steps of:

(1) Step 51: Outputting and storing the m least significant bits ($C_{m-1}$~$C_0$) of the counter.

(2) Step 52: Comparing the output codes: wherein the DNL detector 22 processes the DNL test by analyzing the previous codes of ($C_{m-1}$~$C_0$) when the ADC outputs the code k-1 and the current codes of ($C_{m-1}$~$C_0$) when the ADC outputs the code k;

Step 53: Outputting test results: If the parameter of DNL is within the acceptable range, then the DNL detector 22 outputs a high level signal. If the DNL is not within the acceptable range, the DNL detector 22 outputs a low level signal.

Moreover, if the INL detector 21 and DNL detector 22 both output high level signals, which means the ADC under test 14 pass tests of parameters, the Test Response Analyzer shows Pass/Fail=1. If one of the parameters is not within acceptable ranges, then Pass/Fail is set to 0. Then engineers can differentiate the results to identify the quality of the ADC by the signal of Pass/Fail. Furthermore, a reverse sign of Pass/Fail is available with an additional Inverter Gate. In this design, Pass/Fail=0 represents the parameters are within the acceptable ranges and Pass/Fail=1 gives the results that the parameters are out of the acceptable ranges.

With the testing scheme and method thereof provided in the invention, the static parameters of ADCs can be tested under high accuracy requirement. This scheme can be expanded for detecting dynamic parameters of the ADCs. A system clock pulse is used to trig a counter and inputted to a control circuit that regulates the frequency, duty cycle and amplitude of the system clock pulse to output a regulated clock signal. The regulated clock signal is integrated by the integrator served as a test signal generator to become a called step-ramp signal as a test stimulus. The correct synchronization between the step-ramp signal and the counter output codes is achieved. Then the digital test response analyzer can be designed by analyzing the output codes of the ADC and the references of the output codes of the counter. The step-ramp signal is divided into several segments which contain lots of ramp pieces signals. With the integration of gradually increasing duty cycles of the regulated clock signal to compensate the nonlinear leakage currents depending on the increasing voltages of segments, the high accurate step-ramp signals is generated.

The self-testing process in the invention scheme is simple and not necessary to exhaust great hardware resources to reduce testing and chip costs. Moreover, the scheme can be independently designed or be built in a chip.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A method for testing an analog-to-digital converter (ADC), which comprises the steps of:
    inputting a test trigger signal, system clock pulses, and a power source;
    integrating the system clock pulses to provide a step-ramp signal;
    inputting the step-ramp signal to the ADC under test;
    outputting digital output codes of the ADC under test and a reference counter that counts the system clock pulses as the step-ramp signal increases;
    comparing output codes of the ADC under test and the reference counter; and
    outputting the compared results.

2. The method of claim 1, further comprising a calibration procedure, which comprises the steps of:
    inputting a test trigger signal (Test=1) to activate the calibration procedure, the system clock pulses and a power source (Vp) of a control circuit;
    measuring the step-ramp signal;
    identifying the step-ramp signal;
    adjusting the power source; and
    the voltage of the power source.

3. The method of claim 1, further comprising a test procedure, which comprises the steps of:
    inputting, the system clock pulses, and a calibrated voltage of the power source;
    integrating a regulated clock signal to be the step-ramp signal;
    inputting the step-ramp signal to the ADC under test;
    outputting n-bit output codes of the ADC and n+m-bit output codes of the counter;
    transmitting the output codes of the ADC and the counter to a test response analyzer;
    performing a comparison between the output codes of the ADC and the counter; and
    outputting test results.

4. The method of claim 1, wherein the ADC under test has n output bits, the reference counter has n+m output bits, and the comparing step comprises comparing the n output bits of the ADC under test with the n most significant bits of the counter.

5. An apparatus for testing an n-bit analog-to-digital converter, compnsing:
    a control circuit, which adjusts the frequency, amplitude, and duty cycle of system clock pulses;
    a test signal generator, which contains an integrator that receives the system clock pulses from the control circuit to generate a step-ramp signal;
    a multiplexer, which is controlled by a test trigger signal to choose either a normal signal or a test stimulus;
    an n+m-bit counter that counts the system clock pulses, as the step-ramp signal increases, the n+n-bit counter having output codes that are synchronous with the step-ramp signal and serving as a reference signal generator when analyzing parameters of the n-bit analog-to-digital converter; and
    a test response analyzer, which analyzes the output codes of the n-bit analog-to-digital converter and the n+m-bit counter.

6. The apparatus of claim 5, wherein the control circuit is powered by a driving power source with a function of fine tuning amplitude.

7. The apparatus of claim 5, wherein a test response analyzer comprises an Integral Non-linearity (LNL) detector and a Differential Non-linearity (DNL) detector.

8. The apparatus of claim 7, wherein the INL detector analyzes the n-bit output codes of the n-bit analog-to-digital converter and n most significant output codes of the n+m-bit counter to examine the parameters of Offset Error, Gain Error, and INL.

9. The apparatus of claim 7, wherein the DNL detector analyzes m least significant output codes of the n+m-bit counter to examine a parameter of the DNL.

* * * * *